United States Patent
Rouaissia et al.

(10) Patent No.: US 11,463,088 B2
(45) Date of Patent: Oct. 4, 2022

(54) PROXIMITY SENSOR WITH NONLINEAR FILTER AND METHOD

(71) Applicant: Semtech Corporation, Camarillo, CA (US)

(72) Inventors: Chaouki Rouaissia, Neuchâtel (CH); Remi Le Reverend, San Diego, CA (US); Jerald G. Ott, III, Escondido, CA (US)

(73) Assignee: Semtech Corporation, Camarillo, CA (US)

( * ) Notice: Subject to any disclaimer, the term of this patent is extended or adjusted under 35 U.S.C. 154(b) by 91 days.

(21) Appl. No.: 17/006,347

(22) Filed: Aug. 28, 2020

(65) Prior Publication Data

US 2021/0083664 A1    Mar. 18, 2021

Related U.S. Application Data

(60) Provisional application No. 62/902,212, filed on Sep. 18, 2019.

(51) Int. Cl.
*H03K 17/955* (2006.01)
*G06F 3/044* (2006.01)
*G06F 17/10* (2006.01)

(52) U.S. Cl.
CPC .......... *H03K 17/955* (2013.01); *G06F 3/044* (2013.01); *G06F 17/10* (2013.01)

(58) Field of Classification Search
CPC ........ H03K 17/955; G06F 3/044; G06F 17/10
USPC .............................. 345/174; 324/678; 36/136
See application file for complete search history.

(56) References Cited

U.S. PATENT DOCUMENTS

| | | | | |
|---|---|---|---|---|
| 9,204,796 | B2 * | 12/2015 | Tran | G08B 21/02 |
| 9,209,802 | B1 | 12/2015 | Maharyta et al. | |
| 2008/0042660 | A1 * | 2/2008 | Ely | G06F 3/04166 |
| | | | | 324/678 |
| 2010/0097133 | A1 * | 4/2010 | Philipp | H03K 17/962 |
| | | | | 327/551 |
| 2015/0068069 | A1 * | 3/2015 | Tran | H04B 1/385 |
| | | | | 36/136 |
| 2017/0030716 | A1 * | 2/2017 | Ali | G06T 7/13 |
| 2017/0090609 | A1 * | 3/2017 | Petrovic | G06F 3/044 |
| 2019/0229762 | A1 * | 7/2019 | Nys | H04B 1/3838 |

FOREIGN PATENT DOCUMENTS

| | | |
|---|---|---|
| EP | 3402074 A1 | 11/2018 |
| EP | 3404835 A1 | 11/2018 |
| KR | 10-2013-0097280 A | 9/2013 |

* cited by examiner

*Primary Examiner* — Prabodh M Dharia
(74) *Attorney, Agent, or Firm* — Blank Rome LLP

(57) ABSTRACT

A sensor for a portable connected device. The sensor has a filter arranged to reduce a noise component on a sampled input signal. The is arranged to consider only input measurements that change systematically in a same direction, updating an output value when all the input samples in a predetermined time window are above or below a current output value and, repeating the current output value when the input samples in the time window are below and above the current output value.

8 Claims, 2 Drawing Sheets and illustrated by the figures, in which:
PROXIMITY SENSOR WITH NONLINEAR FILTER AND METHOD

RELATED APPLICATION

This application claims the benefit of U.S. Provisional Application No. 62/902,212, filed Sep. 18, 2019. The entire content of this application is hereby incorporated by reference.

FIELD OF THE INVENTION

The present invention concerns a processor for processing the output of a proximity sensor, and to a smart proximity sensor that is combined with a processor that is arranged to output a signal that discriminates between the proximity to a human body and the proximity to an inanimate object. The present invention is concerned in particular, but not exclusively, with a connected portable device that is equipped with such a smart proximity sensor and is arranged to adapt the RF emitted from a radio interface in order to maintain a Specific Absorption Rate (SAR) within given limits.

DESCRIPTION OF RELATED ART

Capacitive proximity detectors are used in many modern portable devices, including mobile phones and tablets, to determine whether the device is close to a body part of a user. This information is important in several ways: it is used to detect whether the telephone is being actively manipulated by a user, and whether the user is looking at the display, in which case the information displayed can be adapted, and/or the device switch from a low power state to an active one. Importantly, this information is used to adapt the power level of the radio transmitter to comply with statutory SAR limits. Capacitive proximity detection is used also in touch-sensitive displays and panels.

Known capacitive sensing systems measure the capacity of an electrode and, when the device is placed in proximity of the human body (for example the hand, the head, or the lap) detect an increase in capacity. The variations in the sensor's capacity are relatively modest, and often amount to some percent of the "background" capacity seen by the sensor when no conductive body is in the proximity. Known capacitive detection systems may include a digital processor for subtracting drift and noise contributions and deliver a digital value of the net user's capacity in real time and/or a digital binary flag indicating the proximity status based on a programmable threshold.

BRIEF SUMMARY OF THE INVENTION

It is therefore an aim of the present invention to provide a discrimination method for inanimate object in a capacitive proximity detector that overcomes the above limitation.

BRIEF DESCRIPTION OF THE DRAWINGS

The invention will be better understood with the aid of the description of an embodiment given by way of example and illustrated by the figures, in which.

Figure 2:
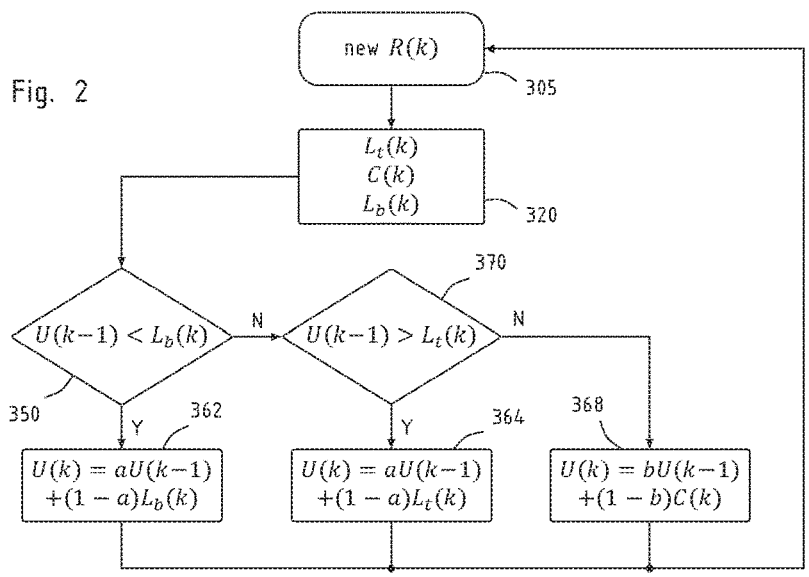
Figure 3:
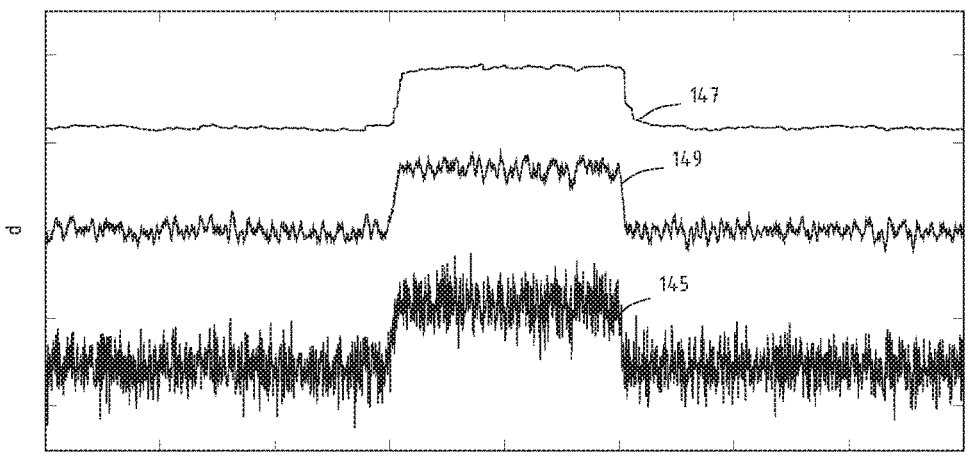
Figure 4:
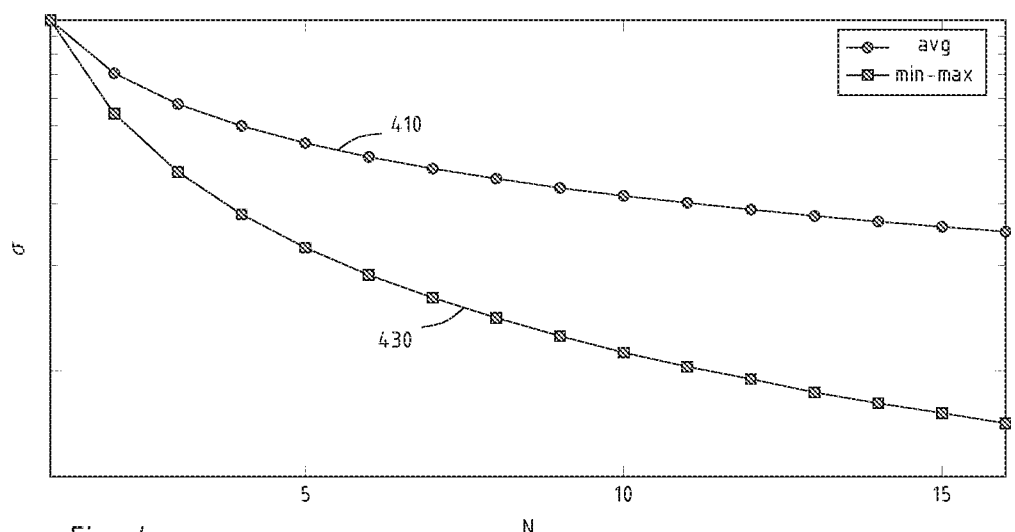

The flowchart of FIG. 2 describes a nonlinear filtering method;

FIG. 3 plots a noisy signal processed by a running average filter and by a nonlinear filter;

FIG. 4 plots the standard deviation in relation to the filter window size;

DETAILED DESCRIPTION OF POSSIBLE EMBODIMENTS OF THE INVENTION

Figure 1:
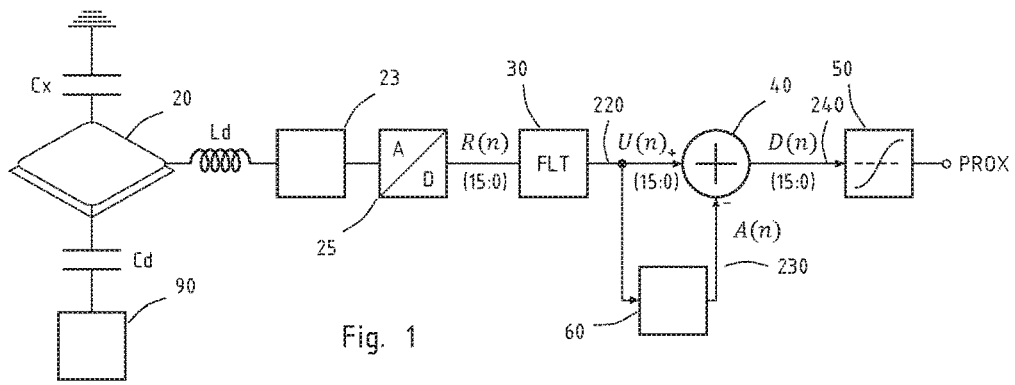
FIG. 1 illustrates schematically a capacitive proximity sensor in a portable connected device.

FIG. 1 shows schematically a capacitive proximity detector in a connected portable device such as a portable phone, laptop computer, or tablet, but it should be understood that the filter and the method of the invention could be applied to diverse fields.

The detector is sensitive to the capacity Cx of an electrode 20 that will increase slightly at the approach of a user's hand, face or body. The variations due to body proximity are overshadowed by the own capacity of the electrode 20 which, in turn, is not stable. The capacity signal is preferably amplified and processed by an analogue processor 23, which may also subtract a programmable offset, and converted into raw digital values by an A/D converter 25. The samples R(n) may be encoded as 16 bits integers, or in any other suitable format.

The raw samples R(n) contain also, in a non-ideal world, noise and unwanted disturbances that are attenuated by a filter 30. The filter 30 which will be described more in detail in the following, provides a series of samples U(n) useful for the processing in the successive stages.

The unit 60 is a baseline estimator that generates a series of samples A(n) that approximate the instantaneous value of the baseline, considering drift. This is then subtracted from the U(n) samples in difference unit 40 and provides the drift-corrected samples D(n). A discriminator unit 50 then generates a binary value 'PROX' that indicates the proximity of the user's hand, face, or body. The invention is not limited to a binary output, however, and encompasses detectors that generate multi-bit proximity values as well.

Should the capacitive proximity sensor be part of a connected portable device for SAR control, the sensor electrode 20 will preferably be placed close to the transmitting antenna of the RF transmitter, to determine accurately the distance from the radio source. The sensor electrode 20 could be realized by a conductor on a printed circuit board or on a flexible circuit board, and may have guard electrodes on the back and at the sides, to suppress detection of bodies and objects at the back or on the sides of the device.

In the same application, the capacitive electrode 20 could serve also as RF antenna, or part thereof. FIG. 1 shows this feature of the invention. The electrode 20 is connected, through a decoupling capacitor Cd, to a radio transmitter and receiver unit 90, and has an inductor Ld, or another RF-blocking element, to block the radiofrequency signal. Otherwise, the radio unit 90 could be connected to an antenna separate and independent from the sense electrode 20 which, in this case, could be connected directly to the analogue interface 23 without the decoupling inductor Ld.

Preferably, the filter 30 implements a non-linear noise suppression algorithm that will now be described with reference to FIG. 2. The entry point 305 is executed on all the raw samples R(k) generated by the ADC 25. The filter unit, which may include hardwired logic blocks, programmed logic, or any combination thereof.

The filter 30 is arranged to consider only the raw measurements R(k) that go systematically in the same direction, updating the output value U(k) when all the input samples R(k) in a predetermined time window are above or below the current output value U(k−1). If, on the other hand, the input values R(k) in the same time window are below and above U(k−1), the output value is not changed.

In a possible implementation, represented by the flow-chart of FIG. 2 the filter 30 computes and maintains an upper limit variable $L_t(k)$ and a lower limit variable $L_b(k)$ that are derived from the recent value or values of R(k). $L_t(k)$ and $L_b(k)$ are determined to enclose between them, at least with good statistical approximation, the values of values of R(k) in a window of N preceding samples (step 320).

In a possible embodiment, $L_t(k)$ and $L_b(k)$ are the minimum and maximum values of R(k) in a window of N preceding samples $$L_t(k) = \min_{i=0,\ldots,N-1} R(k-1)$$

$$L_b(k) = \max_{i=0,\ldots,N-1} R(k-1)$$

where N is a selectable parameter that loosely determines the width of the filtering window. N could be comprised between 4 and 20, in typical implementations. Simulations with N=8 have provided satisfactory results both in noise reduction and sensitivity to small distance changes. N may be a predetermined value hardwired in the filter, a programmable quantity settable by a host system, or a dynamic value.

In another possible variant trading some precision in favour of simplicity and speed, $L_t(k)$ and $L_b(k)$ are derived from the input value plus or minus a predetermined value σ that is chosen having regard to the noise level superimposed to the input signal. If σ is large enough then, at least with good statistical approximation, the previous values R(k) of the input are comprised between $L_t(k)$ and $L_b(k)$, at least in a neighborhood of the current sample.

The filter 30 computes also a variable C(k) that contains a central value of the raw input samples R(k) in the filtering window. The central value C(k) is comprised between $L_b(k)$ and $L_t(k)$ and may be computed in many ways including, for example, an average of $L_b(k)$ and $L_t(k)$, a running average of the input samples R(k) in the filtering window, or a running median of the input samples R(k) in the filtering window.

In the flowchart of FIG. 2 the variables $L_t(k)$, $L_b(k)$, and C(k) are updated at the reception of each new sample R(k). In optimized embodiments, however, these variables may be updated only when needed.

In steps 350 and 370, the values of $L_t(k)$ and $L_b(k)$ are compared with the last determination of the filter's output U(k−1) and, if it is found that U(k−1) is lower than the lower limit $L_b(k)$, or greater that the upper limit $L_t(k)$, the value U(k) of the output is shifted towards the lower limit (step 362), respectively upper limit (step 364).

The output can be shifted towards the appropriate upper or lower limit by a determined fractional amount a, as in the chart of FIG. 2 (blocks 350 and 370): the output value U(k) is a linear combination of the previous output value U(k−1) and the appropriate limit, wherein the previous value is given a weight a and the limit is given a weight (1-a), a being a number between 0 and 1. The value of the weight a could be predetermined, or determined dynamically based on the noise level or a variance of the input value, for example.

In a special embodiment, corresponding to the choice a=0, the output value U(k) is set equal to the appropriate limit $L_t(k)$ respectively $L_b(k)$.

If neither of steps 350 and 370 is satisfied, the output is shifted towards the central value C(k)(step 368). The cycle then repeats when a new successive value of R(k) is produced (step 305). The informed reader will appreciate that the initial value of U is not determined by these recursive steps but can be generated in many ways when the filter is initialized, for example by setting U(0) equal to R(0), to a random value, or simply to zero.

The output can be shifted towards the central value by a determined fractional amount b, as in the chart of FIG. 2: the output value U(k) is a linear combination of the previous output value U(k−1) and the central value C(k), wherein the previous value is given a weight b and the central value is given a weight (1-b), b being a number between 0 and 1. The value of the weight b could be predetermined, or determined dynamically based on, for example, a variance of the input value and is in general different from the weight a applied when shifting the output towards the upper limit or towards the lower limit.

FIG. 3 represents a simulation of the nonlinear filter of the invention. The line 145 is a plot of a simulated signal (a rectangular pulse) with a substantial amount of white noise superimposed. Line 149 plots the same signal after processing with a linear filter: a running average filter with window length N=8. Line 147, finally, shows the output of the filter of the invention also with a window length N=8. It will be appreciated that both the linear filter and that of the invention make the signal stand out of the noise, but the variability of the signal 147 is considerably lower than that of the linear filter 149.

This can be explained recalling that the standard deviation of the output of a linear filter decreases only with the square root of the window length (or pass bandwidth). The filter of the invention is arranged to strongly reduce the probability of output changes due to statistic fluctuations. A peculiarity of the filter of the invention is that small transitory changes could produce little or no effect on the output, in contrast with the output of a linear filter.

An advantage of the filter of the invention is that it provides a strong reduction of the noise fluctuations in a simple algorithm. When the filter is applied to the proximity detector of FIG. 1, it is relatively simple finding a threshold value for the discriminator 50 that provides a reliable proximity trigger, with a minimum of false signals. This would be harder with a simple average. A linear average filter should, to achieve the same result, increase N and lengthen the extension of the window. This measure, however, would increase the computational burden, and reduce the bandwidth, hence the sensitivity to fast transients.

In the frame of the proximity detector of FIG. 1, the nonlinear filtering processor of the invention could replace totally the low pass filter block 30 or be used in combination with a linear digital filter, before or after. It could be inserted ahead of the baseline correction unit 40, 60, as represented, or also after.

FIG. 4 plots the noise reduction versus the number of samples, assuming input R consisting of a constant value with superimposed noise. The noise is plotted as the standard deviation of the output signal. The addressee will appreciate that, in the nonlinear filter of the invention 430, σ decreases faster than in the average filter 410.

REFERENCE NUMBERS USED IN THE FIGURES

| | |
|---|---|
| 20 | electrode |
| 23 | analogue processor |
| 25 | A/D converter |

-continued

| | |
|---|---|
| 30 | filter |
| 40 | difference |
| 50 | discriminator |
| 60 | baseline estimator |
| 90 | receiver |
| 147 | U (x) |
| 145 | R (x) |
| 149 | output of a linear LPF |
| 220 | filtered output U (x) |
| 240 | baseline-corrected signal D (x) |
| 305 | new R (x) value |
| 320 | compute max min and centre value |
| 350 | test filter output against min (k) |
| 362 | set to minimum. |
| 864 | set to maximum |
| 368 | shift output |
| 370 | test filter output against max (k) |
| 410 | variance of a running average filter |
| 430 | variance of the inventive filter. |

The invention claimed is:

1. A portable connected device comprising a sensor arranged to determine whether a user is in proximity to the portable connected device, the sensor comprising a noise-reducing filter receiving a series of digital input values and generating a series of digital output values, wherein the filter is arranged to process input values in a window having a predetermined length time and to:
compute an upper limit and a lower limit based on the input samples in the window, and a central value of the input samples in the window, the central value being comprised between the upper limit and the lower limit,
shifting the output value towards the upper limit when the current input value is above the upper limit, or
shifting the output values towards the lower limit when the current input value is below the lower limit, or
shifting the output value towards the central value in all other cases.

2. The portable connected device of claim 1, wherein the central value is computed as equal to an average of the minimum value and the maximum value, or wherein the central value is computed as equal to a median value of the input samples in the window.

3. The portable connected device of claim 1, wherein the operation of shifting the output value towards the central value comprises a linear combination of the previous output value and the central value, wherein the previous value is given a weight b and the central value is given a weight (1-b), b being a number between 0 and 1.

4. The portable connected device of claim 1, wherein the operation of shifting the output value towards the upper limit or the lower limit value comprises a linear combination of the previous output value and the corresponding limit, wherein the previous value is given a weight a and the central value is given a weight (1-a), a being a number between 0 and 1.

5. The portable connected device of claim 1, comprising a linear low-pass filter.

6. The portable connected device of claim 1, comprising a baseline correction unit and a discriminator.

7. The portable connected device of claim 1, the sensor being a capacitive proximity sensor arranged to determine whether a user is in proximity to the portable connected device based on a capacity seen by a sense electrode.

8. The portable connected device of claim 1, wherein the sense electrode is also an emitter of radio waves.

* * * * *